(12) United States Patent
Hopf et al.

(10) Patent No.: US 12,727,130 B2
(45) Date of Patent: Sep. 1, 2026

(54) INVERTER WITH CLOSED COOLING CHANNEL

(71) Applicant: VIESSMANN CLIMATE SOLUTIONS SE, Allendorf (DE)

(72) Inventors: Markus Hopf, Espenau (DE); Konstantin Steinbach, Baunatal (DE); Alexander Simonow, Frankenberg (DE); Andreas Zacharias, Reiskirchen (DE); Mario Koch, Frankenau (DE); Alexander Maier, Frankenberg (DE); Johann Vogelmann, Burgwald (DE)

(73) Assignee: VIESSMANN CLIMATE SOLUTIONS SE, Allendorf (DE)

( * ) Notice: Subject to any disclaimer, the term of this patent is extended or adjusted under 35 U.S.C. 154(b) by 276 days.

(21) Appl. No.: 18/663,357

(22) Filed: May 14, 2024

(65) Prior Publication Data

US 2024/0389281 A1 Nov. 21, 2024

(30) Foreign Application Priority Data

May 16, 2023 (DE) ..................... 10 2023 112 906.6

(51) Int. Cl.
*H05K 7/20* (2006.01)
*H05K 7/14* (2006.01)
*H10W 40/43* (2026.01)

(52) U.S. Cl.
CPC ..... *H05K 7/20918* (2013.01); *H05K 7/14322* (2022.08); *H05K 7/20145* (2013.01); *H05K 7/20163* (2013.01); *H10W 40/43* (2026.01)

(58) Field of Classification Search
CPC ........... H05K 7/20145; H05K 7/20154; H05K 7/20163; H05K 7/20909; H05K 7/20918; H05K 7/14322; H10W 40/43
See application file for complete search history.

(56) References Cited

U.S. PATENT DOCUMENTS 5,091,823 A * 2/1992 Kanbara ............. H05K 9/0022 361/736
9,585,293 B2 * 2/2017 Yamanaka ......... H05K 7/20918
(Continued)

FOREIGN PATENT DOCUMENTS

CN 102931860 A 2/2013
DE 102019207039 A1 * 11/2020 ........... H05K 7/1432
(Continued)

OTHER PUBLICATIONS

Feb. 8, 2024 Office Action issued in German Patent Application No. 10 2023 112 906.6.

*Primary Examiner* — Zachary Pape
(74) *Attorney, Agent, or Firm* — Oliff PLC

(57) ABSTRACT

An inverter including a housing surrounding an internal space of the inverter. Two boards with power semiconductors disposed thereon are disposed in the internal space. A bracket serves to fix the inverter to a wall. An air intake port for taking in ambient air is disposed in a rear wall. A cooling channel closed with respect to the internal space and fluidly connected to the air intake port and an air exhaust port. A first fan generates an air flow in the cooling channel. Two heat sinks through which the air flow flows are disposed in the cooling channel. A heat sink is disposed on each of the two boards. The heat sinks and the boards are each electrically insulated from one another.

12 Claims, 5 Drawing Sheets

(56) References Cited

U.S. PATENT DOCUMENTS

| | | | | |
|---|---|---|---|---|
| 9,974,214 | B2 * | 5/2018 | Hamari | H05K 7/206 |
| 2024/0388248 | A1 * | 11/2024 | Yeh | H02S 40/345 |
| 2025/0318090 | A1 * | 10/2025 | Sun | H05K 7/20909 |

FOREIGN PATENT DOCUMENTS

| | | | | | |
|---|---|---|---|---|---|
| EP | 2 879 475 | A1 | | 6/2015 | |
| EP | 3 216 330 | B1 | | 4/2019 | |
| JP | 2017085017 | A | * | 5/2017 | |
| WO | WO-2010122632 | A1 | * | 10/2010 | H05K 7/20918 |

* cited by examiner

INVERTER WITH CLOSED COOLING CHANNEL

FIELD OF THE INVENTION

The present invention relates to an inverter, for example for a photovoltaic system and/or a battery system for a building. In particular, the cooling of power electronics components of the inverter arranged on circuit boards is to be optimised.

TECHNICAL BACKGROUND OF THE INVENTION

Nowadays, battery systems are increasingly used for storing electrical energy in buildings, for example in residential buildings, office buildings or other buildings used commercially and/or for residential use. Furthermore, photovoltaic systems (PV systems) are increasingly used for locally generating electrical current. The battery systems are used in particular as current stores or battery stores for the electrical energy generated locally by the PV system.

PV systems and battery current stores supply electrical energy in the form of direct current. In order to make the energy usable for consumers or in order to be able to feed the energy into a public grid, the direct current has to be converted into alternating current. Inverters are used for this purpose. There is thus an increased need for inverters for applications in residential buildings, office buildings or other buildings used commercially and/or for residential use.

Inverters generally use power electronics such as MOSFETs (metal oxide semiconductor field effect transistors) and/or IGBTs (bipolar transistors with insulated gate electrode). During operation of this power electronics, a large amount of heat can be generated, which has to be dissipated in order to ensure safe and interference-free operation of the power electronics. There is therefore a need to provide inverter devices with cooling that can dissipate the generated heat in a suitable manner.

Inverter devices that use the ambient air for cooling the power electronics are known in the prior art. For example, European patent EP 3 216 330 B1 discloses an inverter for a photovoltaic system having a housing with a chamber and a cooling air channel formed in the chamber for conducting ambient air as cooling air for electrical and/or electronic components of the inverter that are arranged along the cooling air channel. The cooling air channel is guided through the housing from an air intake port to an air exhaust port. A further air exhaust port, which is arranged above the air intake port and above the air exhaust port, is provided in the cooling air channel between two of the components to be cooled.

If, however, the air exhaust port is arranged in the vicinity of the air intake port, it may occur that the heated cooling air is drawn in again through the air intake port, so that already heated air is used for cooling, which can reduce the cooling power.

In addition, in the known solutions, electronic components are partially arranged in the cooling air channel, which can thus have direct contact with the drawn-in ambient air. This can lead to contamination of the electronic components with contaminants in the ambient air.

OBJECT UNDERLYING THE INVENTION

The object underlying the present invention is to overcome the problems known in the prior art and to provide an inverter with closed cooling channel that is improved compared to the prior art. In particular, cooling of power electronics components of the inverter arranged on circuit boards is to be optimised thereby.

SOLUTION ACCORDING TO THE INVENTION

The object is achieved according to the invention by an inverter according to claim 1. The inverter according to the invention comprises a housing, at least two circuit boards with power electronics, at least one bracket, a rear wall, at least one air intake port, at least one air exhaust port, at least one cooling channel, at least one first fan and heat sinks disposed in the cooling channel.

The housing surrounds an internal space of the inverter. The bracket serves to fix the inverter to a wall in or on a building. The bracket is formed such that a distance for taking in air remains between the rear wall and the wall.

At least two boards with power semiconductors or power semiconductor components disposed thereon are disposed in the internal space. The power semiconductors can be, for example, MOSFETs (metal oxide semiconductor field effect transistors) and/or IGBTs (bipolar transistors with insulated gate electrode). The power semiconductors serve in particular to convert a direct current into an alternating current and/or vice versa. The power semiconductors are designed in particular to switch high currents of more than one ampere. The resulting heat is dissipated by the air flow in the cooling channel in order to avoid damage to the power semiconductors.

The air intake port for taking in ambient air is disposed in the rear wall. The air exhaust port serves to discharge the air after it has flowed through the cooling channel, wherein the air can heat up.

The cooling channel is closed with respect to the internal space and fluidly connected to the air intake port and the air exhaust port. In other words, air for cooling the inverter is drawn in via the air intake port, flows through the cooling channel and is discharged again via the air exhaust port. The first fan generates the air flow in the cooling channel.

A closed cooling channel prevents the internal space from being contaminated by dirt such as dust in the ambient air or the like. Furthermore, the closed cooling channel can optimize the cooling of the power electronics since targeted cooling of the circuit boards on which the power electronics components are arranged is made possible by means of the heat sinks arranged in the cooling channel.

At least two heat sinks through which the air flow flows are disposed in the cooling channel, wherein a heat sink is disposed on each of the at least two boards. The heat generated by the power semiconductor is thus conducted via the circuit boards to the heat sinks and then transferred to the air flow by the heat sinks. The heat sinks thus improve the heat transfer from the power electronics to the air flow in the cooling channel.

The boards can have different electrical potentials. In order to avoid a flow of current between the circuit boards, the at least two heat sinks and the at least two circuit boards are electrically insulated from one another. Electrically insulated here means, for example, that an electrical resistance between the circuit boards is greater than a predefined limit value. The limit value can be, for example, a few kΩ to a few MΩ.

In particular, grounding surfaces of the circuit boards are electrically insulated from one another in order to avoid grounding loops. However, the fact that the circuit boards are electrically insulated from one another does not preclude electrical signals, for example, being transferred by means of corresponding lines between electronic components which are arranged on different circuit boards.

A first heat sink which is arranged on a first circuit board is thus not electrically conductively connected to a second heat sink which is arranged on a second circuit board.

PREFERRED EMBODIMENTS OF THE INVENTION

Advantageous embodiments and developments which can be used individually or in combination with one another are the subject matter of the dependent claims.

The housing is preferably removable. According to a preferred embodiment, the housing can be cuboid and comprises a right-hand side wall, a left-hand side wall, an upper side wall, a lower side wall, a front wall and the rear wall. The side walls are perpendicular to the front wall and rear wall. The side walls and the front wall can preferably be embodied as a one-piece cover element which can be placed onto the rear wall and fixed thereto in order to close the housing.

The bracket is preferably disposed on the rear wall. Further preferably, the printed circuit boards are fixed to the rear wall. The rear wall can thus serve as a carrier for the power electronics and can be fixed to a wall, for example in a room in a building, when the inverter is installed. The cover element can then be placed onto the rear wall and fixed thereto in order to seal the internal space. The cover element can be removed from the rear wall for maintenance work or the like.

The cooling channel preferably has a plastic enclosure and the heat sinks are disposed in the plastic enclosure. The plastic enclosure can advantageously seal the cooling channel from the internal space so that no air exchange with the internal space takes place. The plastic enclosure is preferably electrically insulating so that it does not produce an electrically conductive connection between the heat sinks.

According to a preferred embodiment, the heat sinks are each formed as an aluminum profile having a plurality of flow channels and/or a plurality of cooling fins. The plurality of flow channels and/or cooling fins increases the surface area of the heat sink and can thus advantageously improve the heat transfer with the air flow in the cooling channel.

The printed circuit boards are preferably substantially rectangular printed circuit boards. The power semiconductors can each be disposed on a first main side of the printed circuit boards. Accordingly, the heat sinks can each be disposed on a second main side of the printed circuit boards opposite the first main side. In particular, the printed circuit boards can have a continuous surface coated with copper on the second main side in order to improve a heat transfer to the heat sinks. In the case of a multilayer printed circuit board, the heat conduction between the first main surface and the second main surface can be effected for example via vias, or, according to a preferred refinement, a solid copper plate, aluminum plate or other metal plate or composite plate having good thermal conductivity can be used.

A heat-conducting film can be disposed between the heat sink and the printed circuit board. In this way, the heat transfer from the respective printed circuit board to the heat sink can be further improved so that the power electronics on the printed circuit board can be cooled more efficiently.

A region on the second main side of the printed circuit board in which the heat sink is disposed can overlap with a region on the first main side of the printed circuit board where the power semiconductors are disposed, in a plan view of the first or second main side. In this way, the distance between the heat sink and the power electronics to be cooled can be reduced so that the heat transfer from the power electronics to the heat sinks can be further improved. In addition, in this way it is possible to prevent the heat generated by the power electronics from flowing through other regions of the printed circuit board and heating the latter.

The plastic enclosure is preferably comprised of a plurality of segments disposed overlapping at their respective boundaries. Due to the overlapping, the cooling channel can be sealed particularly efficiently from the internal space even if a plurality of segments are used. Furthermore, the segments make it possible to easily adapt the geometric shape of the cooling channel to the arrangement and number of circuit boards in the internal space of the inverter.

According to a preferred embodiment, the cooling channel can, for example, have one segment per printed circuit board, which can, for example, have a U-shaped cross-section and surround the respective heat sink. The segment can be closed by the printed circuit board at the open side of the cross-section. Furthermore, the segment can preferably have edges at the ends of the U-shaped profile which engage under the heat sink at the transition between heat sink and printed circuit board in order to efficiently seal the segment.

The cross-section of the segments of the cooling channel does not have to be U-shaped and can be selected in a suitable manner in order to seal the plastic enclosure from the printed circuit board. For example, the profile can be rounded, rectangular, polygonal, oval or the like in cross-section.

According to an alternative embodiment, the segments of the plastic enclosure can be arranged only between the heat sinks, wherein the heat sinks themselves are designed as segments of the cooling channel which are closed from the internal space. In this case, the air can flow from one segment of the plastic enclosure directly into the plurality of flow channels of a heat sink and then into a further segment of the plastic enclosure. The heat sinks and the segments of the plastic enclosure can be disposed correspondingly overlapping for sealing the cooling channel and preferably have seals at the transitions.

Seals are preferably disposed between the segments to hermetically seal the plastic enclosure from the internal space. The seals can, for example, be O-rings with an angular or rounded shape corresponding to the cross-section of the segments. The seals are, for example, made of rubber or another suitable sealing material.

The air intake port can comprise a first air intake port and a second air intake port disposed preferably separately from each other in the rear wall. The flow cross-section can hereby be increased, so that more air can be drawn in to improve the cooling power.

The first air intake port and the second air intake port can preferably be disposed at an edge of the rear wall to also draw in air from the sides of the inverter as efficiently as possible. An improved air exchange with the room in which the inverter is constructed can hereby be made possible so that the cooling power can be further improved.

The first fan is preferably disposed between the first air intake port and the second air intake port. The first fan is particularly preferably disposed centrally or symmetrically between the two air intake ports. The first fan can thus draw in the air for cooling the inverter uniformly from the first air intake port and the second air intake port. The cooling power can hereby be further improved.

According to a preferred refinement, the cooling channel has a first horizontal cooling channel portion and a second vertical cooling channel portion. The first horizontal cooling channel portion preferably connects the first and second air intake ports to the first fan. In particular, the first air intake port and the second air intake port are disposed at the ends of the first horizontal cooling channel portion, wherein the fan is preferably disposed centrally between the air intake ports in the first horizontal cooling channel portion.

The second vertical cooling channel portion is preferably fluidly connected to the air exhaust port and the first horizontal cooling channel portion. In particular, the first fan is disposed between the first horizontal cooling channel portion and the second vertical cooling channel portion. The first fan thus draws in the air via the first horizontal cooling channel portion and conveys it further outwards via the second vertical cooling channel portion and the air exhaust port.

The air can, for example, be drawn in via the two air intake ports at the rear wall, so that it flows in two partial air flows in mutually opposite directions through the first horizontal cooling channel portion to the first fan, where the partial air flows combine and flow further through the second vertical cooling channel portion to the air exhaust port.

The air exhaust port is preferably disposed at an upper edge of the rear wall or in the upper side wall. The heated exhaust air is thus advantageously discharged away from the air intake ports. Due to its higher temperature, the exhaust air can rise upwards away from the air intake ports. It is thus advantageously possible to prevent warm exhaust air from being drawn in through the air intake ports.

A rotation axis of a fan wheel of the first fan can in particular be disposed perpendicular to the rear wall. In addition, the first horizontal cooling channel portion can preferably be disposed in front of the rear wall in the internal space in plan view. The second vertical cooling channel portion can preferably be disposed behind the rear wall and outside the internal space in plan view. In other words, the drawn-in cold supply air flows through the first horizontal cooling channel portion in the internal space and the heated exhaust air flows outside the internal space through the second vertical cooling channel portion. This spatial separation of supply air and exhaust air can further improve the cooling power.

According to a preferred embodiment, a second fan for generating a circulating air flow can be disposed in the internal space. It is hereby advantageously possible to prevent hot regions from forming in the internal space and the cooling of the inverter can be improved.

Furthermore, the internal space can be divided into a first chamber and a second chamber by a partition disposed in particular perpendicular to the rear wall. The division into chambers can take place in particular such that sensitive components in the first chamber can be shielded from heat from the second chamber by the partition. According to preferred embodiments, a plurality of partitions can also be disposed in the internal space in order to divide the internal space into more than two chambers.

Preferably, the second fan can be disposed at an opening in the partition for causing an air flow between the first and second chambers. The cooling of the components in the interior of the inverter can hereby be further improved.

BRIEF DESCRIPTION OF THE DRAWINGS

Further advantageous embodiments are described in more detail below with reference to an exemplary embodiment which is illustrated in the drawings but to which the invention is not restricted.

There are shown schematically.

DETAILED DESCRIPTION OF EXEMPLARY EMBODIMENTS

In the following description of preferred embodiments of the present invention, identical reference signs denote identical or comparable components.

FIGS. 1 to 5 illustrate an exemplary embodiment of an inverter 1 according to the invention having a housing 2 surrounding an internal space of the inverter 1. Three boards P1, P2, P3 are disposed in the internal space, on which a plurality of power semiconductors and further electronic components are each disposed in regions B1, B2, B3.

Figure 1:
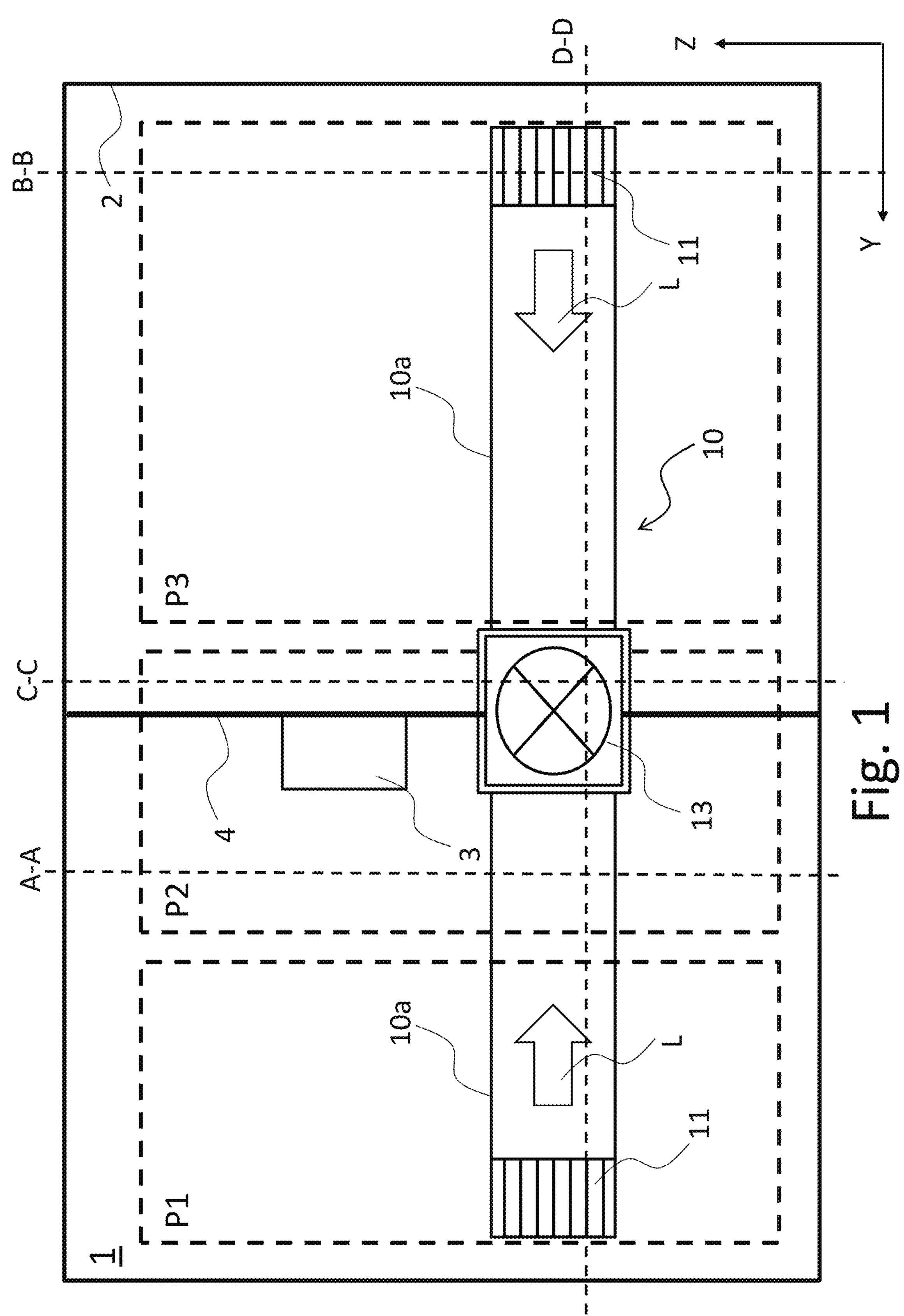
FIG. 1 shows a plan view from behind of an exemplary embodiment of an inverter according to the invention.

FIG. 1 is a schematic view of the rear wall from behind. Four sectional planes are indicated by the dashed lines A-A, B-B, C-C and D-D in FIG. 1. FIGS. 2 to 5 each show the corresponding perspective sectional views.

The coordinate axes X, Y, Z illustrated in FIGS. 1 to 5 each illustrate the directions of a right-handed, right-angled coordinate system, wherein the Z axis points upward when looking from the front onto the inverter 1 fixed to a wall, the Y axis points from the left to the right, and the X axis points onto the observer. In other words, the Z axis is the direction of the height, the X axis is the direction of the depth and the Y axis is the direction of the width of the inverter.

The power semiconductors disposed in the regions B1, B2, B3 can be, for example, MOSFETs and/or IGBTs. During operation of the inverter 1, the power semiconductors generate heat that is transferred to the circuit boards P and has to be dissipated in order to prevent damage to the power semiconductors by heat.

The inverter 1 comprises a bracket (not illustrated in the figures) for fixing the inverter 1 to a wall. By way of example, the inverter 1 can be fixed to a wall in a cellar or some other operating space in a building, where electrical connections are provided, via which the inverter 1 can be connected to a battery system and/or a PV system and to an internal power grid of the building and/or to a grid connection point. The inverter 1 can preferably convert direct current into alternating current and/or alternating current into direct current.

The inverter 1 has a rear wall 5, which here substantially serves as a base plate for the construction of the inverter 1. When the inverter 1 is mounted on a wall, the rear wall 5 is disposed parallel to the wall. The bracket can be disposed, for example, on the rear wall 5 and comprise a plurality of holding elements.

In the illustrated example, two air intake ports 11 for taking in ambient air are disposed in the rear wall 5. These air intake ports 11 are fluidly connected to a cooling channel 10 closed with respect to the internal space. The air intake ports 11 are illustrated here as rectangular, and can also be round or polygonal in other embodiments, for example.

A first fan 13 is disposed in the cooling channel 10 and generates an air flow L in the cooling channel 10, such that ambient air is drawn into the cooling channel 10 via the air intake ports 11 in the rear wall. A direction of the air flow L is indicated by arrows in the figures.

A first horizontal cooling channel portion 10*a* of the cooling channel 10 runs parallel to the rear wall 5 in the Y direction, has a substantially rectangular cross-section and is fluidly connected to the first and second air intake ports 11 and the first fan 13. A second vertical cooling channel portion 10*b* runs on the other side of the rear wall 5 parallel to the rear wall in the Z direction as far as the air exhaust port 12.

The first fan 13 is disposed at a round opening in the rear wall 5, through which the drawn-in air flows from the first horizontal cooling channel portion 10*a* into the second vertical cooling channel portion 10*b*. The air flows further through the second vertical cooling channel portion 10*b* to the air exhaust port 12 at the upper side of the housing 2 and is discharged there to the environment.

Three heat sinks 14 through which the air flow flows are disposed in the cooling channel 10. One of the heat sinks 14 is disposed on each of the three boards P1, P2, P3. The heat sinks 14 improve the cooling of the power conductors since they improve the heat transfer to the air flowing in the cooling channel 10.

The heat sinks 14 are embodied, for example, as metal profiles made of aluminum or an aluminum alloy or another suitable metal material, which each have a plurality of flow channels through which the cooling air flows in the cooling channel 10. In alternative embodiments, the heat sink 14 can have fins in addition to the flow channels or instead of the flow channels. Both the flow channels and the fins increase the surface area of the heat sink 14 so that the heat transfer between heat sink and cooling air can be significantly improved.

According to the invention, the boards P1, P2, P3 and the heat sinks 14 disposed thereon are each electrically insulated from one another. It can hereby advantageously be achieved that the boards P1, P2, P3 can have different electrical potentials.

A heat-conducting film can be provided between the heat sinks 14 and the boards P1, P2, P3 in order to improve the heat conduction between boards P1, P2, P3 and heat sinks.

The first horizontal cooling channel portion 10*a* has a plastic enclosure 15, wherein the heat sinks 14 are disposed in the plastic enclosure. The plastic enclosure 15 serves to seal the cooling channel 10 from the internal space of the inverter 1.

The plastic enclosure 15 is comprised of a plurality of segments disposed overlapping at their respective boundaries. Seals are disposed between the segments to hermetically seal the plastic enclosure 15 from the internal space.

Figure 4:
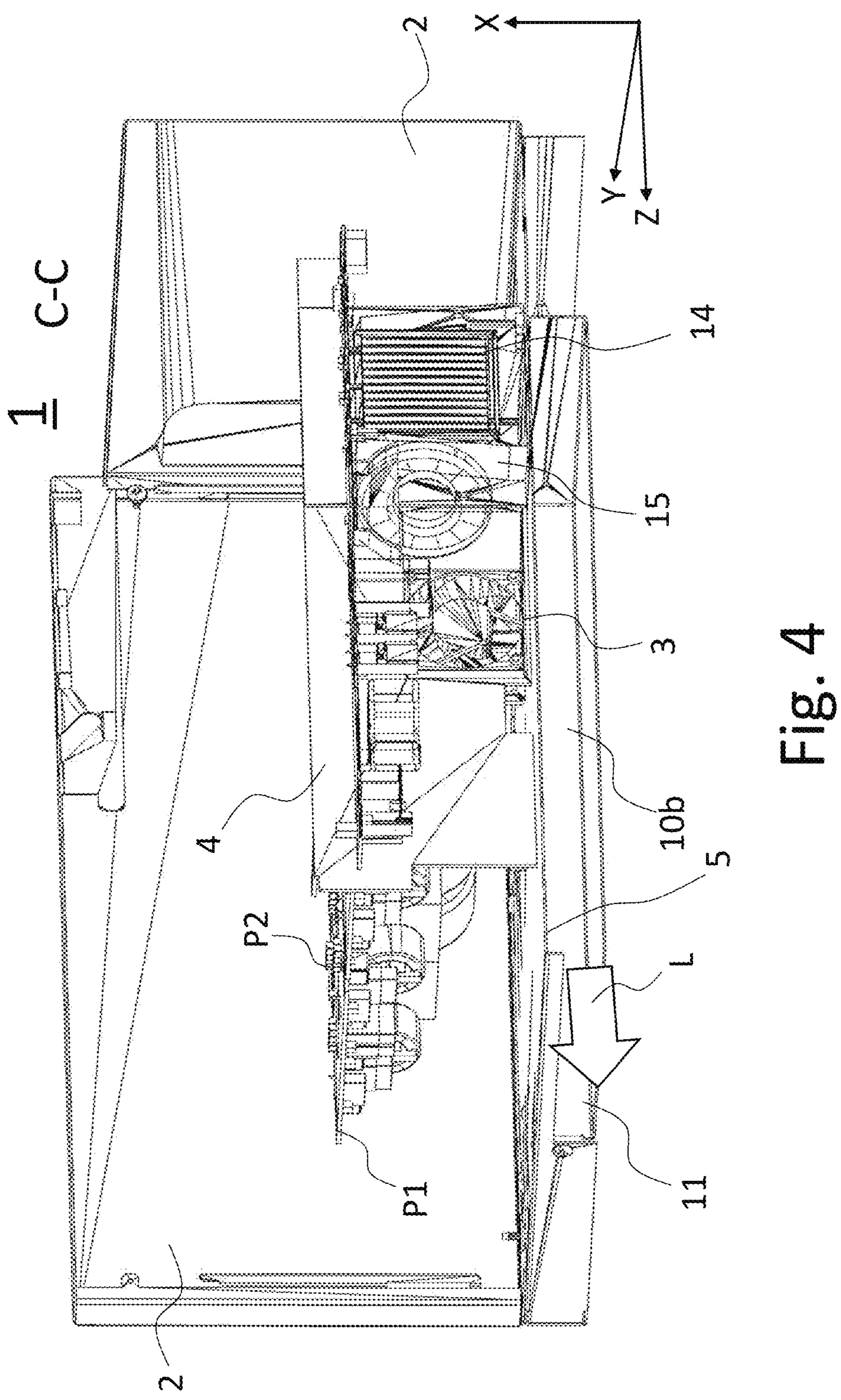
FIG. 4 shows a perspective sectional view along the line C-C in FIG. 1.

FIG. 4 shows a second fan 3 for generating a circulating air flow in the internal space. The circulating air flow can advantageously prevent hot regions from forming in the internal space of the inverter 1 and the cooling of the components of the inverter 1 can be improved.

Furthermore, the internal space is divided into a first chamber and a second chamber by a partition 4 disposed perpendicular to the rear wall 5. The division into chambers takes place here such that sensitive components in the first chamber can be shielded from heat from the second chamber by the partition 4.

The second fan 3 is disposed at an opening in the partition 4 for causing an air flow between the first and second chambers. The cooling of the components in the interior of the inverter 2 can hereby be further improved.

Figure 2:
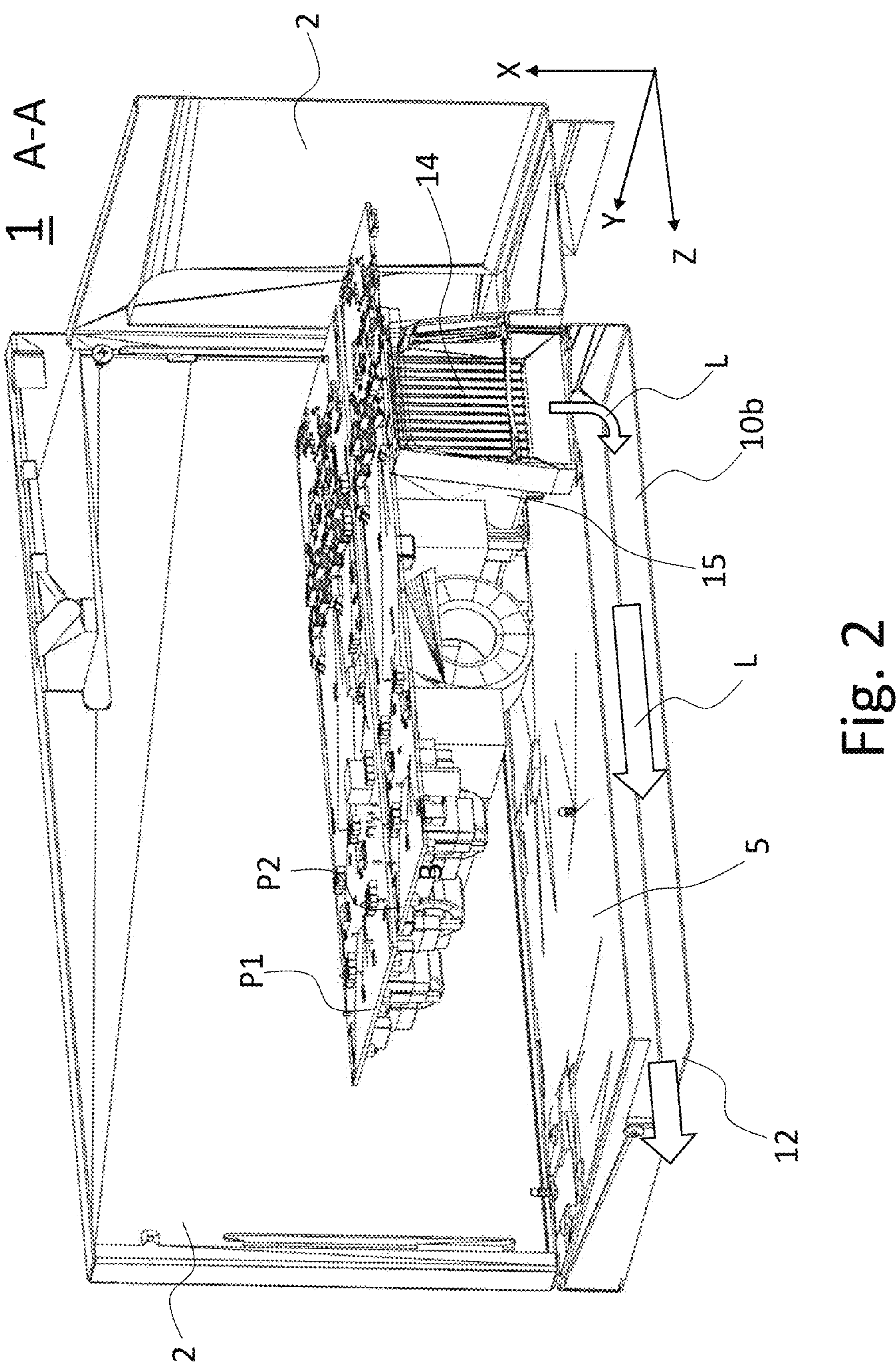
FIG. 2 shows a perspective sectional view along the line A-A in FIG. 1.
Figure 5:
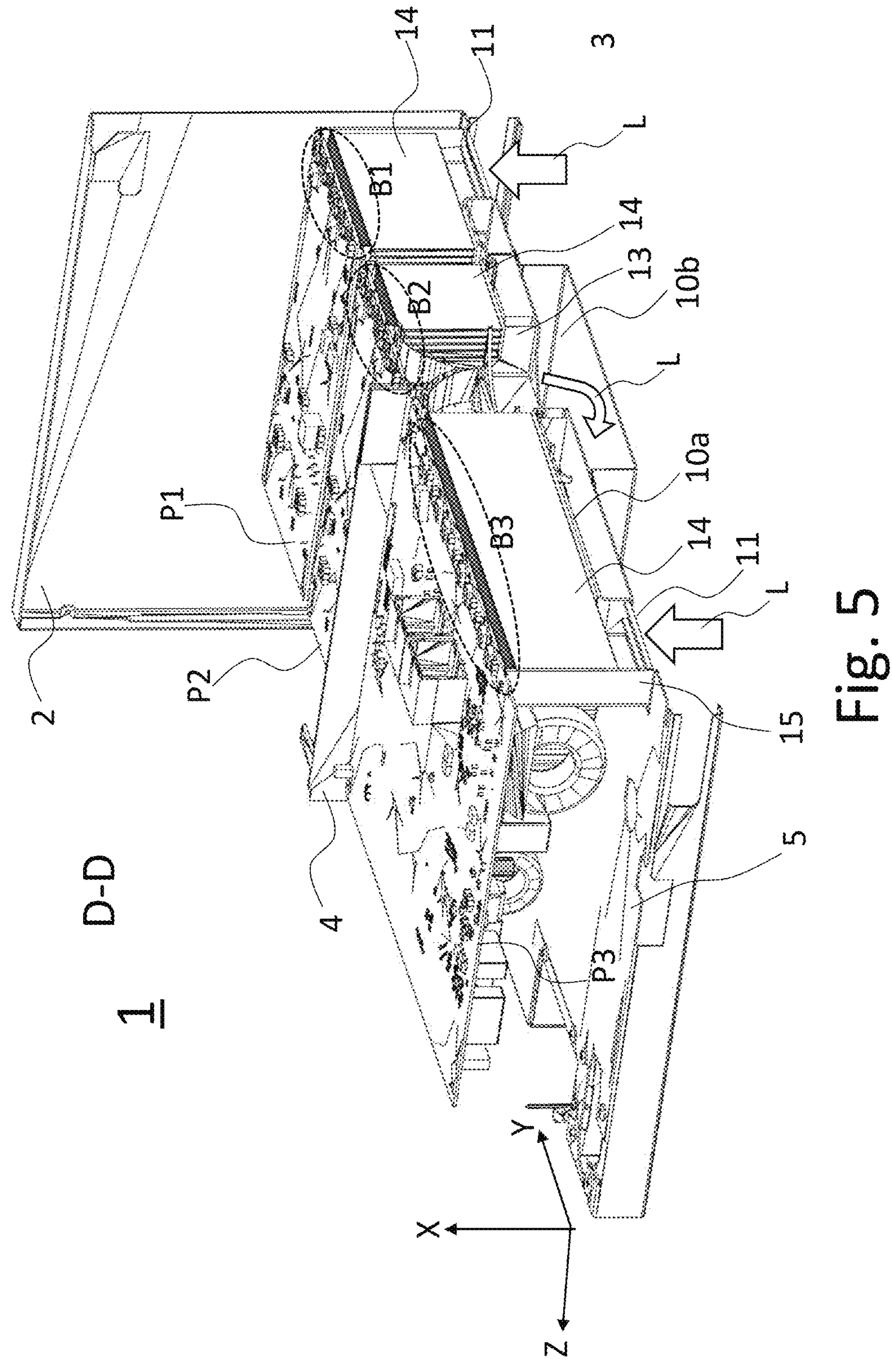
FIG. 5 shows a perspective sectional view along the line D-D in FIG. 1.

As can be clearly seen, for example, in FIGS. 2 and 5, the first horizontal cooling channel portion 10*a* is disposed in front of the rear wall 5 in the internal space in plan view (counter to the X direction). The second vertical cooling channel portion 10*b* is disposed behind the rear wall 5 and thus outside the internal space in plan view. In other words, the first horizontal cooling channel portion 10*a* is disposed on a first side of the rear wall 5 and the second vertical cooling channel portion 10*b* is disposed on the other side of the rear wall 5. A separation of cold supply air and warm exhaust air in the cooling channel 10 can hereby be achieved, whereby the cooling of the components in the internal space of the inverter 1 can be further improved.

Figure 3:
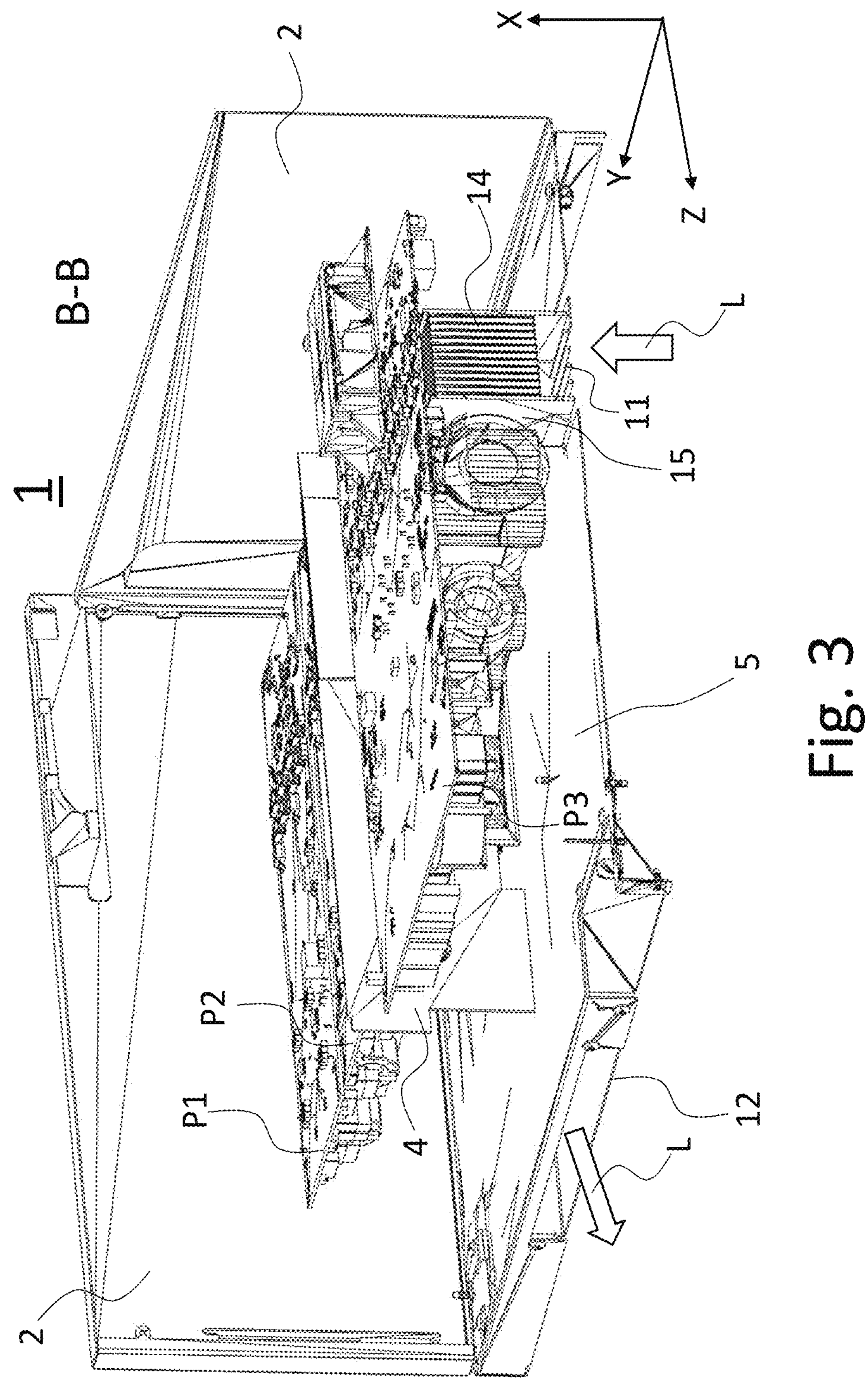
FIG. 3 shows a perspective sectional view along the line B-B in FIG. 1.

In addition, it can be clearly seen, for example, in FIG. 3, that the direction of the intake (X direction) of the cold ambient air at the air intake port 11 is perpendicular to the direction of the discharge (Z direction) of the heated cooling air at the air exhaust port 12. Furthermore, the intake takes place at a lower end of the rear wall 5 and the discharge of the air takes place at the upper side of the housing 2. Both a spatial separation and a separation of the flow direction can thus be achieved, so that it is possible to largely prevent heated air from being drawn in for cooling.

The cooling concept of the inverter 1 according to the invention can thus spatially separate the intake of fresh ambient air for cooling from the discharge of heated air. Furthermore, a more efficient heat dissipation from the boards P to the cooling air is achieved by the heat sinks 14. In addition, the cooling channel 10 is sealed from the internal space, so that contamination of the internal space is prevented and targeted cooling is achieved. Furthermore, the cooling channel 10 and the heat sinks 14 are segmented, so that electrical contact between the boards P can be avoided.

The features disclosed in the preceding description, the claims and the drawings can be of importance both individually and in any desired combination for the realization of the invention in its various embodiments.

The invention claimed is:

1. An inverter comprising:
- a housing surrounding an internal space of the inverter;
- at least two boards disposed in the internal space with power semiconductors disposed thereon;
- a bracket for fixing the inverter to a wall;
- a rear wall having an air intake port disposed in the rear wall for taking in ambient air;
- an air exhaust port;
- a cooling channel closed with respect to the internal space and fluidly connected to the air intake port and the air exhaust port;
- a first fan for generating an air flow in the cooling channel;
- at least two heat sinks through which the air flow flows and which are disposed in the cooling channel, wherein
- a heat sink is disposed on each of the at least two boards; and
- the heat sinks and the boards are each electrically insulated from one another.

2. The inverter according to claim 1, wherein:
- the cooling channel has a plastic enclosure and the heat sinks are disposed in the plastic enclosure; and/or
- the heat sinks are each formed as an aluminum profile having a plurality of flow channels and/or a plurality of cooling fins.

3. The inverter according to claim 2, wherein:
- the plastic enclosure is comprised of a plurality of segments disposed overlapping at their respective boundaries; and
- seals are disposed between the segments to hermetically seal the plastic enclosure from the internal space.

4. The inverter according to claim 1, wherein:

the power semiconductors are each disposed in regions on a first main side of the boards; and the heat sinks are each disposed on a second main side of the boards opposite the first main side.

5. The inverter according to claim 4, wherein:

the boards each have a different electrical potential; and/or a heat-conducting film is disposed between the heat sink and the board.

6. The inverter according to claim 4, wherein:

the regions on the second main side of the board where the heat sinks are each disposed overlap with the regions on the first main side of the board where the power semiconductors are disposed, in a plan view of the first or second main side.

7. The inverter according to claim 1, wherein:

the air intake port comprises a first air intake port and a second air intake port disposed separately from each other in the rear wall; and the first fan is disposed between the first air intake port and the second air intake port.

8. The inverter according to claim 7, wherein:

the cooling channel has a first horizontal cooling channel portion and a second vertical cooling channel portion;

the first horizontal cooling channel portion is fluidly connected to the first and second air intake ports and the first fan; and the second vertical cooling channel portion is fluidly connected to the air exhaust port and the first horizontal cooling channel portion.

9. The inverter according to claim 8, wherein:

the first fan is disposed between the first horizontal cooling channel portion and the second vertical cooling channel portion; and/or a rotation axis of a fan wheel of the first fan is disposed perpendicular to the rear wall; and/or the first horizontal cooling channel portion is disposed in front of the rear wall in the internal space in plan view; and/or the second vertical cooling channel portion is disposed behind the rear wall and outside the internal space in plan view.

10. The inverter according to claim 1, further comprising a second fan for generating a circulating air flow in the internal space.

11. The inverter according to claim 10, wherein the second fan is disposed at an opening in the partition for causing an air flow between the first and second chambers.

12. The inverter according to claim 1, wherein the internal space is divided into a first chamber and a second chamber by a partition disposed perpendicular to the rear wall.

* * * * *